(12) United States Patent
Lu et al.

(10) Patent No.: US 9,698,139 B1
(45) Date of Patent: Jul. 4, 2017

(54) INTEGRATED CIRCUITS WITH ELECTROSTATIC DISCHARGE PROTECTION

(71) Applicant: Globalfoundries Singapore Pte. Ltd., Singapore (SG)

(72) Inventors: Xiangxiang Lu, Singapore (SG); Manjunatha Prabhu, Singapore (SG); Chien-Hsin Lee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,623

(22) Filed: Dec. 31, 2015

(51) Int. Cl.
*H01L 27/02* (2006.01)

(52) U.S. Cl.
CPC ................................ *H01L 27/0255* (2013.01)

(58) Field of Classification Search
CPC .................................................. H01L 27/0255
See application file for complete search history.

(56) References Cited

U.S. PATENT DOCUMENTS

| | | | |
|---|---|---|---|
| 8,633,543 B2 * | 1/2014 | Ohta | H01L 27/0262 257/127 |
| 2010/0321840 A1 * | 12/2010 | Bobde | H01L 27/0266 361/56 |
| 2015/0349522 A1 * | 12/2015 | Miller | H05K 9/006 361/56 |

* cited by examiner

*Primary Examiner* — Ida M Soward
(74) *Attorney, Agent, or Firm* — Lorenz & Kopf, LLP

(57) ABSTRACT

Integrated circuits with components for protection from electrostatic discharge are provided. An integrated circuit includes a first common line and a second common line. A first electrostatic discharge line is in electrical communication with the first and second common lines. The first electrostatic discharge line includes a first diode and a first clamping device.

19 Claims, 2 Drawing Sheets

INTEGRATED CIRCUITS WITH ELECTROSTATIC DISCHARGE PROTECTION

TECHNICAL FIELD

The technical field generally relates to integrated circuits with electrostatic discharge protection and methods of producing the same, and more particularly relates to integrated circuits with electrostatic discharge protection that activates after a predetermined discharge voltage is reached, and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Circuit designs that reduce the number of components used for a required function can reduce circuit component crowding.

Many integrated circuits include a plurality of common lines (including ground lines), and these common lines are typically electrically connected together with protective electrostatic discharge lines. Theses electrostatic discharge lines (ESD lines) are often provided in pairs, where one ESD line is configured for current flow in one direction between a pair of common lines, and the other mated ESD line is configured for current flow in the opposite direction. Diodes are typically used to configure an ESD line for a desired direction of flow, where a diode allows current to flow in one direction but not in the other.

The electrical connection of different common lines can lead to current leakage from one common line to another, where this current leakage is commonly referred to as "noise." Noise is typically produced by a voltage spike in one common line that results in current being transferred to another common line. Noise can be limited by establishing a discharge voltage for the ESD line, where current is not transferred through the ESD line if the voltage drop between the common lines is less than the discharge voltage, but current is allowed to flow if the voltage drop is greater than the discharge voltage. Typically, a preset voltage is required for a single diode to allow current flow, so when a discharge voltage that is higher than the preset voltage is desired, a plurality of diodes are positioned in series. The preset voltage is typically about 0.5 volts for many types of diodes used in the ESD lines. Therefore, if the desired discharge voltage is 4 time higher than the preset voltage, 4 diodes are connected in series in each of the two mated ESD lines. If the desired discharge voltage is 8 times higher than the preset voltage, then 8 diodes are included in each of the two mated ESD lines. Forming ESD lines with several diodes uses valuable space in an integrated circuit, and extra components provide more opportunities for failure.

Accordingly, it is desirable to provide integrated circuits with ESD lines that have fewer components than an ESD line with multiple diodes, and methods of producing the same. In addition, it is desirable to provide integrated circuits with ESD lines where the discharge voltage can be set at a wide variety of values without requiring additional diodes for higher discharge voltages. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing such integrated circuits are provided. In an exemplary embodiment, an integrated circuit includes a first common line and a second common line. A first electrostatic discharge line is in electrical communication with the first and second common lines. The first electrostatic discharge line includes a first diode and a first clamping device.

An integrated circuit is provided in another embodiment. The integrated circuit includes a first common line and a second common line. A first electrostatic discharge line is electrically connected to the first and second common lines. The first electrostatic discharge line blocks current flow when a voltage drop between the first and second common lines is below a first discharge voltage. The first electrostatic discharge line includes a single first diode having a first turn on voltage, where the first turn on voltage is less than the first discharge voltage.

A method of producing an integrated circuit is provided in yet another embodiment. The method includes forming a first common line and a second common line. A first electrostatic discharge line is formed in electrical communication the first and second common lines, where the first electrostatic discharge line includes a first diode and a first clamping device.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

A "common line," as used herein, means an electrically conductive line in electrical communication with a power supply neutral point, or with an electrical ground, or with both a power supply neutral point and an electrical ground. Various circuits or sub-circuits are typically completed by electrically connecting to the common line. Electrical circuits typically include a power supply hot line and a common line, where the hot line has a higher voltage or potential than the common line such that current generally flows from the hot line to the common line. "Electrical communication" between two or more components, as used herein, means electrical current can flow between the different components, where the current may or may not flow through additional components between the two or more components. "Electrical connection" between two or more components, as used herein, means electrical current can flow directly between the different components, such that the different components are either directly connected together or a conductive line directly connects the different components together with no intervening components between the different components that are electrically connected. As used herein, an "electrically conductive material" is a material with a resistivity of about $1\times10^{-4}$ ohm meters or less and an "electrically insulating material" is a material with a resistivity of about $1\times10^{4}$ ohm meters or more.

Figure 1:
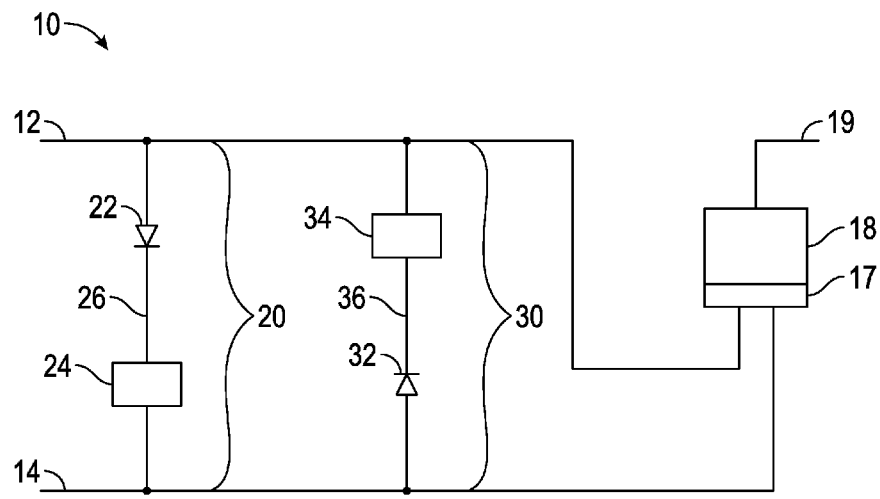
FIGS. 1 and 2 illustrate a portion of an integrated circuit schematic in accordance with exemplary embodiments.

Referring to FIG. 1, an integrated circuit 10 includes a first common line 12 and a second common line 14. As used herein, the term "integrated circuit" means a circuit of electronic components, such as transistors, resistors, and capacitors, constructed on and/or in a semiconductor wafer or chip, in which the electronic components are interconnected to perform a given function, wherein at least some of the electronic components are positioned within about 50 microns or less from each other. The first and second common lines 12, 14 may be electrically connected, such as at a neutral point 17 of a power supply 18, but in many embodiments the first and second common lines 12, 14 are employed in the service of different sub-circuits (not illustrated) within the integrated circuit 10. The different sub-circuits served by the first and second common lines 12, 14 may be virtually any sub-circuits included in the integrated circuit 10, where a sub-circuit includes one or more electronic components such as transistors, resistors, capacitors, diodes, etc. In an exemplary embodiment, the first and second common lines 12, 14 are not electrically connected for at least most of the length of the first and second common lines 12, 14, such as about 95 percent of the length of the first and second common lines 12, 14. The first and/or second common lines 12, 14 may be employed in more than one sub-circuit, where a common line may carry current from more than one sub-circuit to the power supply 18. The power supply 18 also includes a hot line 19, where the hot line 19 has a higher voltage than the neutral point 17 and the first and second common lines 12, 14.

The integrated circuit 10 also includes a first electrostatic discharge line 20 that is in electrical communication with the first and second common lines 12, 14. In some embodiments, the first electrostatic discharge line 20 is electrically connected (i.e., directly connected) to one or both of the first and second common lines 12, 14. The first electrostatic discharge line 20 includes a first diode 22 and a first clamping device 24 in series, and may include a first conductive line 26 electrically connecting two or more of the first diode 22, the first clamping device 24, and the first and second ground lines 12, 14. As used herein a "clamping device" is a device that allows current flow when a voltage drop across the clamping device is above a set value, and blocks current flow when the voltage drop across the clamping device is below the set value. As used herein, reference to a component or components "allowing" current flow indicates the component or components have a resistance of about 1 ohm or less, or about 0.5 ohms or less, or about 0.1 ohm or less in various embodiments when allowing current flow, and a component or components "blocking" current flow indicates a resistance of about 100 ohms or greater, or about 1 megaohms (Mohms) ohms or greater, or about 100 Mohms or greater in various embodiments. The first diode 22 and the first clamping device 24 may be directly physically connected together and may directly connect to the first and second common lines 12, 14, in which case the first optional conductive line 26 would not be present. The first electrostatic discharge line 20 is configured to transfer a preset amount of current, for example about 1.4 amperes (amps) of current or more to drain sufficient charge from the first or second common lines 12, 14 to provide protection for electrical surges. The first diode 22, the first clamping device 24, and the optional first conductive line 26 are components of the first electrostatic discharge line 20 and are connected in series, so each component is capable of transferring the preset amount of current e.g. 1.4 or more amps each. In alternate embodiments, the preset amount of current may be about 2 amps or more or about 10 amps or more.

In an exemplary embodiment, the first diode 22 is configured to allow current to flow from the first common line 12 to the second common line 14, but blocks current flow from the second common line 14 to the first common line 12. As such, the first diode 22 has an anode in electrical communication with the first common line 12, and the first diode 22 has a cathode in electrical communication with the second common line 14. The first diode 22 may have a first turn-on voltage, where the first diode 22 blocks current flow in both directions when the voltage drop (potential difference) across the first diode 22 is less than the first turn-on voltage. The first diode 22 allows current flow in one direction when the voltage drop across the first diode 22 is equal to or greater than the first turn-on voltage (as long as the higher voltage is on the anode of the first diode 22). In an exemplary embodiment, the first turn-on voltage is about 0.5 volts.

The first diode 22 can be any type of diode that allows current to flow in one direction while blocking current flow in the other direction. In the embodiment illustrated in FIG. 1, the first diode 22 is positioned between the first clamping device 24 and the first common line 12, but the position of the first diode 22 and the first clamping device 24 can be switched in some embodiments such that the first clamping device 24 is between the first diode 22 and the first common line 12.

The first clamping device 24 serves as a switch that blocks current flow (or has a high resistance, as described above) when the voltage drop across the first clamping device 24 is less than a first clamping device switch voltage. When the voltage drop across the first clamping device 24 is equal to or greater than the first clamping device switch voltage, the resistance of the first clamping device 24 drops significantly to allow current flow. For example, if the first clamping device 24 is exposed to a voltage drop about 10 percent less than the first clamping device switch voltage, the first clamping device blocks current flow with a high first clamping device resistance, such as about 100 ohms, about 1,000 ohms, or about 5,000 ohms. If the first clamping device 24 is exposed to a voltage drop about equal to or greater than the first clamping device switch voltage, the first clamping device 24 allows current flow with a low first clamping device resistance, such as about 1 ohm, about 0.5 ohms, or about 0.1 ohms. The change in resistance of the first clamping device 24 occurs rapidly at about the first clamping device switch voltage. A wide variety of electronic components can serve as a clamping device, including but not limited to a field effect transistor, an NPN transistor, a PNP transistor, and a silicon controlled rectifier. In an exemplary embodiment with a transistor (a field effect transistor, an NPN transistor, or a PNP transistor), a drain of the transistor is in electrical communication with the first ground line 12, and a source and a gate of the transistor are both in electrical communication with the second common line 14. The type and design of the first clamping device 24 may be selected to provide a desired first clamping device switch voltage.

The first electrostatic discharge line 20 has a first discharge voltage, where the first electrostatic discharge line 20 (including the first diode 22, the first clamping device 24, and the optional first conductive line 26) allows current flow when the voltage drop between the first and second common lines 12, 14 is equal to or greater than the first discharge voltage. The first electrostatic discharge line 20 blocks current flow when the voltage drop between the first and second common lines 12, 14 is less than the first discharge voltage. The voltage drop between the first and second common lines 12, 14 is the difference in voltage between the first and second common lines 12, 14. In an exemplary embodiment, the first clamping switch voltage is within about 10 percent or less of the first discharge voltage, so the first clamping switch voltage largely determines the first discharge voltage. The first discharge voltage may be somewhat higher than the first clamping switch voltage in some embodiments because of resistance, such as resistance from the first diode 22 or the optional first conductive line 26. Reference to the first electrostatic discharge line allowing current flow when the voltage drop is greater than the first discharge voltage only applies when the first common line 12 has a higher voltage than the second common line 14, and does not apply with the second common line 12 has a higher voltage than the first common line 12, because the first diode 22 blocks reverse current flow.

In some embodiments and referring again to FIG. 1, a second electrostatic discharge line 30 is similar to the first electrostatic discharge line 20, except the second electrostatic discharge line 30 is configured to allow current to flow from the second common line 14 to the first common line 12 (i.e., in the opposite direction as the first electrostatic discharge line 20.) The second electrostatic discharge line 30 includes a second diode 32, a second clamping device 34, and an optional second conductive line 36, and the first and second common lines 12, 14 are in electrical communication with the second electrostatic discharge line 30. In some embodiments, the second electrostatic discharge line 30 directly contacts the first and/or second common line 12, 14, so the second electrostatic discharge line 30 may be electrically connected to the first and/or second common line 12, 14. The second clamping device 34 has a second clamping device switch voltage that may be within about 10% of a second discharge voltage of the second electrostatic discharge line 30, as described above for the first electrostatic discharge line 20. The second electrostatic discharge line 30, when combined with the first electrostatic discharge line 20, balances the electrostatic discharge protection of the first and second common lines 12, 14.

Figure 2:
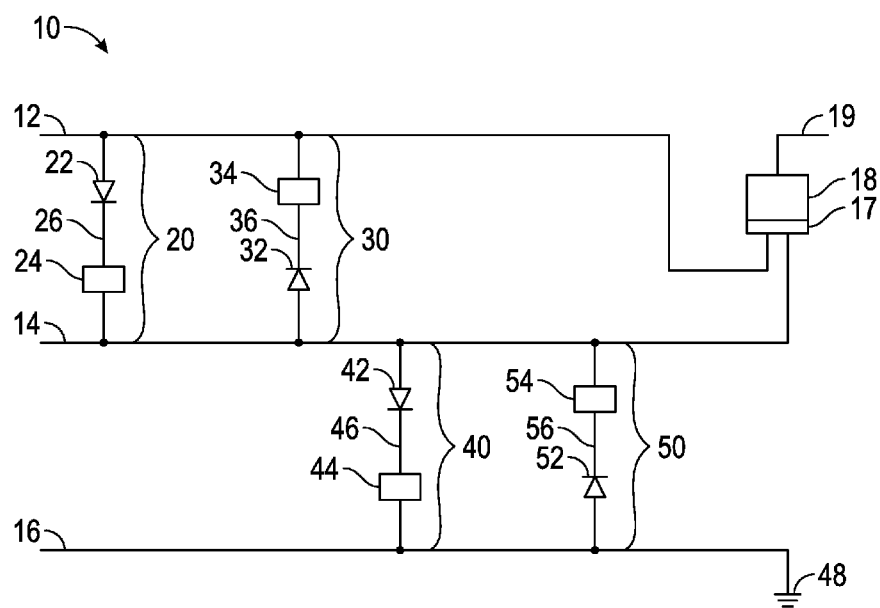

In some embodiment and referring now to FIG. 2, the integrated circuit 10 may include a third common line 16, wherein the third common line 16 is similar to the first and second common lines 12, 14 described above. In the illustrated embodiment, the third common line 16 is electrically connected to a ground 48 instead of to the neutral point 17 of the power supply 18, but other embodiments are also possible. A third electrostatic discharge line 40 and a fourth electrostatic discharge line 50 are in electrical communication (and optionally in electrical contact) with the third common line 16 and one or more of the first and second common lines 12, 14. The third electrostatic discharge line 40 includes a third diode 42, a third clamping device 44, and an optional third conductive line 46, and the fourth electrostatic discharge line 50 includes a fourth diode 52, a fourth clamping device 54, and an optional fourth conductive line 56, as described above for the first and second electrostatic discharge lines 20, 30. The integrated circuit 10 may include additional common lines (not illustrated) and additional electrostatic discharge lines (not illustrated) in alternate embodiments.

Figure 3:
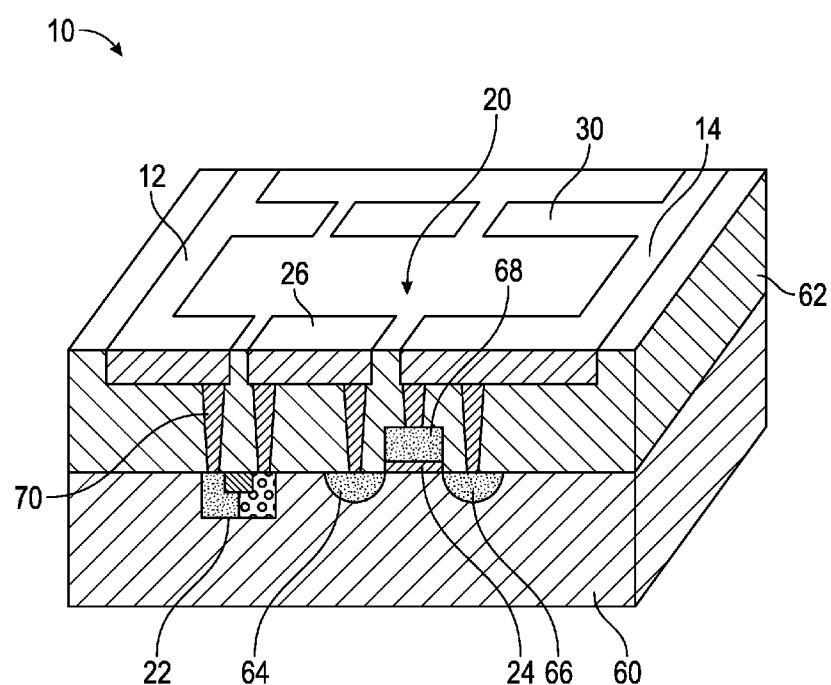
FIG. 3 illustrates a portion of an embodiment of the integrated circuit of FIGS. 1 and 2 and methods for its fabrication in a sectional perspective view.

An exemplary embodiment of the first electrostatic discharge line 20 is illustrated in a perspective sectional view in FIG. 3, with continuing reference to FIG. 1. The first electrostatic discharge line 20 is electrically connected to the first and second common lines 12, 14. The first diode 22 is formed in a substrate 60, and the first clamping device 24 is formed with a first drain 64 and a first source 66 within the substrate 60 and a first gate 68 overlying the substrate 60, but other embodiments are also possible. The first conductive line 26 is formed in an interlayer dielectric 62 overlying the substrate 60, and the first and second common lines 12, 14 are formed in the interlayer dielectric 62. As used herein, the term "overlying" means "over" such that an intervening layer may lie between the first electrostatic discharge line 20 and the substrate 60, and "on" such that the first electrostatic discharge line 20 physically contacts the substrate 60. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer or may be a thin layer of silicon on an insulating layer (commonly known as silicon-on-insulator or SOI) that, in turn, is supported by a carrier wafer. The interlayer dielectric 62 is an electrically insulating material overlying the substrate 60, such as silicon dioxide, silicon nitride, or other materials.

The first clamping device 24 is illustrated in FIG. 3 as a field effect transistor with the first drain 64 and the first source 66 formed in the substrate 60, and the first gate 68 formed overlying the substrate 60 between the first source 66 and the first drain 64, but the first clamping device 24 may be other types of electronic components in alternate embodiment as described above. The first drain 64 of the first clamping device 24 is electrically connected to the first diode 22 through the first conductive line 26, and the first diode 22 is electrically connected to the first common line 12 through a contact 70. The first source 66 and the first gate 68 are electrically connected to the second common line 14 through additional contacts 70. The second diode 32 and second clamping device 34 are not visible in FIG. 3. Contacts 70 are formed through the interlayer dielectric 62 to electrically connect the various components. The contacts 70 may provide essentially vertical electrical connections between various underlying components and horizontal portions of the first conductive line 26. Contacts 70 may generally provide an electrical connection between components that are vertically separated. Different types of diodes, clamping devices, and conductive lines may be used in alternate embodiments.

The first and second electrostatic discharge lines 20, 30 allow for controlled current flow between the first and second common lines 12, 14, where current flow at low voltages can be blocked or controlled. In this manner, voltage variations in one common line may be blocked from leaking to another common line, even when the two common lines are in electrical communication through the electrostatic discharge lines. As such, the first and second electrostatic discharge lines 20, 30 protect the first and second common lines 12, 14 from voltage surges while limiting unintended current transfer ("noise"). The first and/or second electrostatic discharge lines may each include a single diode and/or a single clamping device, as illustrated, so two electrical components (the diode and clamping device) per electrostatic discharge line are sufficient to provide voltage surge protection for a common line.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a first common line;
   a second common line;
   a first electrostatic discharge line in electrical communication with the first common line and in electrical communication with the second common line, wherein the first electrostatic discharge line comprises a first diode and a first clamping device in series; and
   a second electrostatic discharge line in electrical communication with the first common line and in electrical communication with the second common line, wherein the second electrostatic discharge line comprises a second diode and a second clamping device in series.

2. The integrated circuit of claim 1 wherein the first diode is configured to allow current to flow from the first common line to the second common line and to block current flow from the second common line to the first common line, and wherein the second diode is configured to allow current to flow from the second common line to the first common line and to block current flow from the first common line to the second common line.

3. The integrated circuit of claim 1 further comprising:
   a third common line; and
   a third electrostatic discharge line electrically connected to the third common line and electrically connected to one of the first common line or the second common line, wherein the third electrostatic discharge line comprises a third diode and a third clamping device.

4. The integrated circuit of claim 1 wherein the first clamping device is selected from the group consisting of a field effect transistor, a PNP transistor, an NPN transistor, a silicon controlled rectifier, or a combination thereof.

5. The integrated circuit of claim 1 wherein the first diode has a first turn-on voltage, and wherein the first electrostatic discharge line has a first discharge voltage greater than the first turn-on voltage.

6. The integrated circuit of claim 1 wherein the first clamping device comprises a first source, a first drain, and a first gate, and wherein the first drain is electrically connected to the first common line, the first source is electrically connected to the second common line, and the first gate is electrically connected to the second common line.

7. The integrated circuit of claim 6 wherein the first diode is configured to allow current to flow from the first common line to the second common line and to block current flow from the second common line to the first common line.

8. The integrated circuit of claim 1 where the first electrostatic discharge line is configured to transmit about 1.4 amps or more of electrical current.

9. The integrated circuit of claim 1 wherein the first clamping device has a first clamping device switch voltage and the first electrostatic discharge line has a first discharge voltage, wherein the first clamping device switch voltage is within about 10 percent of the first discharge voltage.

10. The integrated circuit of claim 1 wherein a cathode of the first diode is electrically connected to a drain of the first clamping device.

11. The integrated circuit of claim 1 wherein an anode of the first diode is electrically connected to a source of the first clamping device.

12. An integrated circuit comprising:
    a first common line;
    a second common line; and
    a first electrostatic discharge line electrically connected to the first common line and electrically connected to the second common line, wherein the first electrostatic discharge line blocks current flow when a voltage drop between the first common line and the second common line is below a first discharge voltage, and wherein the first electrostatic discharge line comprises a single first diode having a first turn-on voltage less than the first discharge voltage.

13. The integrated circuit of claim 12 further comprising:
    a second electrostatic discharge line electrically connected to the first common line and electrically connected to the second common line, wherein the second electrostatic discharge line blocks current flow when a voltage drop between the second common line and the first common line is below a second discharge voltage, wherein the second electrostatic discharge line comprises a single second diode having a second turn-on voltage less than the second discharge voltage, wherein the first diode is configured to allow current to flow from the first common line to the second common line and to block current flow from the second common line to the first common line, and wherein the second diode is configured to allow current to flow from the second common line to the first common line and to block current flow from the first common line to the second common line.

14. The integrated circuit of claim 13 wherein the second electrostatic discharge line comprises a single second clamping device.

15. The integrated circuit of claim 12 wherein the first electrostatic discharge line is configured to transmit about 1.4 amps of current or more.

16. The integrated circuit of claim 12 wherein the first electrostatic discharge line comprises a first clamping device, wherein the first clamping device comprises a first clamping device switch voltage such that when the voltage drop between the first common line and the second common line is about 10 percent less than the first clamping device switch voltage a first clamping device resistance is about 1,000 ohms or greater, and the first clamping device resistance is about 1 ohm or less when the voltage drop between the first common line and the second common line is about equal to or greater than the first clamping device switch voltage.

17. The integrated circuit of claim 16 wherein the first electrostatic discharge line comprises one first clamping device.

18. The integrated circuit of claim 16 wherein the first clamping device comprises a first source, a first drain, and a first gate, and wherein the first drain is electrically connected to the first common line, the first source is electrically connected to the second common line, and the first gate is electrically connected to the second common line.

19. A method of producing an integrated circuit comprising:
   forming a first common line;
   forming a second common line;
   forming a first electrostatic discharge line in electrical communication with the first common line and in electrical communication with the second common line, wherein the first electrostatic discharge line comprises a first diode and a first clamping device; and
   forming a second electrostatic discharge line in electrical communication with the first common line and in electrical communication with the second common line, wherein the second electrostatic discharge line comprises a second diode and a second clamping device in series.

* * * * *